(12) United States Patent
Hönigschmid et al.

(10) Patent No.: US 6,645,809 B2
(45) Date of Patent: Nov. 11, 2003

(54) PROCESS FOR PRODUCING A CAPACITOR CONFIGURATION

(75) Inventors: Heinz Hönigschmid, Essex Jct., VT (US); Thomas Röhr, Yokohama (JP)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/995,209

(22) Filed: Nov. 27, 2001

(65) Prior Publication Data

US 2002/0081790 A1 Jun. 27, 2002

(30) Foreign Application Priority Data

Nov. 27, 2000 (DE) .......................................... 100 58 782

(51) Int. Cl.⁷ ......................................... H01L 21/8242
(52) U.S. Cl. ....................... 438/253; 438/254; 438/396; 257/306
(58) Field of Search .................................. 438/243, 244, 438/253, 254, 386, 387, 396, 397; 257/295, 300, 303, 306

(56) References Cited

U.S. PATENT DOCUMENTS 6,198,652 B1  3/2001  Kawakubo et al.

6,445,023 B1 * 9/2002  Vaartstra et al. ............ 257/295

FOREIGN PATENT DOCUMENTS

JP       2000-156472 A       6/2000

OTHER PUBLICATIONS

Search Report issued by the German Patent and Trademark Office on Sep. 24, 2001.
Daisaburo Takashima et al.: "High–Density Chain Ferroelectric Random Access memory (Chain FRAM)", IEEE Journal of Sold State Circuits, vol. 33, No. 5, May 1998, pp. 787–792.

* cited by examiner

*Primary Examiner*—Phat X. Cao
*Assistant Examiner*—Theresa T. Doan
(74) *Attorney, Agent, or Firm*—Laurence A. Greenberg; Werner H. Stemer; Gregory L. Mayback

(57) ABSTRACT

In order to provide a particularly space-saving capacitor configuration in a memory device, a plurality of second electrode regions which are not in direct electrical contact with one another are formed on areas of a first electrode region covered by a dielectric material. During operation of the capacitor configuration, portions of the first electrode region form bottom electrodes which are connected by a connecting region, so that an additional connecting device for the bottom electrodes is not necessary.

15 Claims, 9 Drawing Sheets

PROCESS FOR PRODUCING A CAPACITOR CONFIGURATION

BACKGROUND OF THE INVENTION

Field of the Invention

The invention relates to a process for producing a capacitor configuration.

In highly integrated memory devices, the information contents of the memory cells are, for example, recorded and provided through the use of appropriate capacitors. During the production of the memory devices or the memory cells on a semiconductor substrate, these capacitors are formed on the semiconductor substrate by using a structuring process and are wired appropriately. In the case of highly integrated circuits, the space required by the individual components, in particular therefore also the space required for the storage capacitors, is a significant factor.

It has therefore been proposed to form a plurality of substantially mutually independent storage capacitors in relation to an electrode in each case, for example the lower or bottom electrode, to be electrically connected to one another, so that the capacitors connected in this way can be formed physically particularly closely adjacent to one another, since specific contacts or lines can be used jointly and do not have to be formed multiple times. In this case, each capacitor is provided with its lower or bottom electrode on a carrier, on which, at least partly, a dielectric layer is provided, which is then followed, at least partly, by the separately provided upper or top electrodes. In order to develop the concept of the capacitor chain, an appropriate electrical connection has to be provided, for example in relation to the lower or bottom electrodes.

In known capacitor configurations having capacitor chains, in particular in the case of chain FeRAMs (Ferroelectric Random Access Memories) or CFRAMs (Chain Ferroelectric Random Access Memories), as they are called, it is a problem that the size of the storage capacitors cannot be below a specific minimum size of the storage capacitors, because of the functional reliability that needs to be provided. This applies even if, instead of a two-dimensional, planar capacitor configuration, three-dimensional capacitor configurations are provided by using corresponding side walls of three-dimensional structures.

In addition, when complying with all the rules on how to configure such a semiconductor component, it is currently not possible to achieve the necessary theoretical cell areas or capacitor areas. This is because the corresponding capacitors have to be formed larger than would be absolutely necessary, because of the production process.

SUMMARY OF THE INVENTION

It is accordingly an object of the invention to provide a process for producing a capacitor configuration, and a corresponding capacitor configuration, which overcome the above-mentioned disadvantages of the heretofore-known processes and configurations of this general type and in which the capacitors in the capacitor configuration are formed in a particularly space-saving way on a carrier.

With the foregoing and other objects in view there is provided, in accordance with the invention, a process for producing a capacitor configuration having a plurality of capacitors with a common contact region, the process includes the steps of:

forming a first electrode region on a surface region of a carrier;

forming at least one dielectric region at least partly on the first electrode region;

forming a common, substantially coherent second electrode region by directly applying an electrode material to the at least one dielectric region; and forming a plurality of second electrodes by structuring the common, substantially coherent second electrode region such that the second electrodes are formed over regions of the first electrode region covered by the at least one dielectric region and such that the second electrodes are not in direct electrical contact with one another.

In other words, in the process for producing a capacitor configuration, in particular a memory device or the like having a plurality of capacitors on a carrier, in particular on a semiconductor substrate or the like, having a common contact region, at least one first electrode region is formed on a surface region of the carrier. Furthermore, at least one dielectric region is formed, at least partly, on the first electrode region. Furthermore, at least one second electrode region is formed, at least partly, on the dielectric region.

The process according to the invention for producing a capacitor configuration is characterized in that, on the first electrode region, on regions thereof covered by the dielectric region, a plurality of second electrode regions which are substantially at least not in direct electrical contact are formed.

It is therefore a basic idea of the process according to the invention to form a plurality of spatially separated and/or independent second electrode regions on a common first electrode region covered by a dielectric. Through the use of this procedure, a corresponding plurality of mutually closely adjacent capacitors is formed, the first common electrode region being used jointly by all the capacitors as one electrode, for example as a bottom electrode. The second electrode regions located opposite the first electrode region which, for example, is formed as a bottom electrode, are at least not in direct electrical contact with one another and thus in each case form the corresponding mating electrode for each capacitor in the plurality of capacitors. The advantage of this procedure, as compared with the prior art, is that it is no longer necessary for a separate first electrode region to be formed on the carrier for each individual capacitor in the capacitor configuration. The separation of the capacitors is therefore provided by the spatial separation of the second electrode regions with respect to their physical distance and with respect to their electrical insulation. This capacitor configuration or capacitor chain therefore substantially uses one electrode jointly, so that an additional connecting device needed in the prior art in the form of a connecting region or the like is not needed. In addition to possible further miniaturization and higher integration of the capacitor configuration, its production is thus also simplified since it is precisely the application or structuring of the additional connecting regions for the connected first electrodes or bottom electrodes that can be dispensed with. As a result, a corresponding lithography step or the like becomes obsolete.

According to a particularly preferred embodiment of a process according to the invention, provision is made for at least part of the plurality of second electrode regions to be formed by direct application of an appropriate electrode material to the respective dielectric region. In the case of this measure, therefore, the configuration of the second electrode regions is brought about directly through the use of the process of applying the appropriate material.

On the other hand, it is advantageous for at least part of the plurality of second electrode regions to be formed by applying a common and substantially coherent second electrode region to the dielectric region and then by subsequently structuring it. As opposed to the aforementioned procedure, therefore, here first of all a specific region of the dielectric region or else the entire dielectric region is substantially coherently coated with the material for the second electrode regions. The structuring of the individual separate second electrode regions is then carried out through the use of subsequent appropriate structuring, for example by using a mask/etching process.

In another embodiment of the process according to the invention, a plurality of dielectric regions that are substantially at least not in direct contact is formed on the first electrode region. This has the advantage that as a result of the provision of a plurality of separate and thus spatially separated dielectric regions, prestructuring on the first electrode region is carried out with regard to the second electrode regions to be formed.

The formation of the plurality of dielectric regions is advantageously carried out through the use of direct application of an appropriate dielectric material to the respective first electrode region. As a result, therefore, the configuration and selection of the dielectric regions is in each case already provided when the appropriate dielectric is applied.

On the other hand, it is advantageous for at least part of the plurality of dielectric regions to be formed by the application of a common and substantially coherent dielectric region to the respective first electrode region and by subsequent structuring. In this alternative or additional measure, therefore, firstly a coherent region is coated with the dielectric and the geometric configuration and formation of the separate dielectric regions is subsequently implemented through the use of appropriate structuring, for example by using a mask/etching process.

It is particularly preferred for at least part of the plurality of second electrode regions to be formed by the substantially flush and/or covering application of an appropriate electrode material on dielectric regions formed at least in the region of the first electrode regions. This is carried out in particular by a joint and/or simultaneous structuring of coherent dielectric regions and second electrode regions, the coherent dielectric regions being gradually formed on the first electrode region. This measure therefore achieves the situation in which, as an alternative to the procedure in which a plurality of mutually separated second electrode regions is formed on a coherent dielectric region, the second electrode regions are implemented substantially flush and coincident with the correspondingly formed dielectric regions. This can also be carried out, for example, by the first electrode region firstly being covered, at least partly, by a dielectric region and then subsequently covered with the material for the second electrode regions. The formation of the plurality of second separate electrode regions can then be carried out by appropriate simultaneous structuring of the second electrode regions and of the dielectric regions, if appropriate up to the surface of the first electrode regions.

In this case, it is additionally also advantageous if the first electrode region, according to a further embodiment of the process according to the invention, is structured, i.e. removed, in an intermediate region between adjacent second electrode regions and/or dielectric regions, in particular from a side facing away from the carrier, by forming, with a structuring step, connecting regions which connect respective first electrode regions, such that the intermediate region is substantially removed except for the connecting region and such that the respective first electrode regions are produced. This means that the plurality of capacitors is implemented by an appropriate pattern being cut into a coherent layer structure, including the first electrode region and the dielectric region and second electrode region provided over the first, so that second electrode regions which are independent and physically separate from one another are formed, for example as top electrodes or the like, the coherence of the first electrode region, which is provided on the carrier, and of the corresponding electrical contact being maintained.

The first electrode region is advantageously used as a common bottom electrode for the plurality of capacitors belonging to the capacitor device. Alternatively or additionally, provision is made for the second electrode regions to be used as separate top electrodes for the plurality of capacitors belonging to the capacitor configuration.

The process according to the invention is suitable in particular for the production of a capacitor configuration for a memory device having FeRAM cells or the like, in particular according to the chain capacitor principle, chain FeRAM or CFRAM cells.

A capacitor configuration produced according to the production process according to the invention and produced in particular for a memory device or the like, having a plurality of capacitors on a carrier, in particular a semiconductor substrate or the like, each capacitor having a bottom electrode provided on the carrier, a dielectric layer provided at least partly thereon and a separate top electrode provided at least partly thereon, and the capacitors having a common electrical connection in relation to the bottom electrode, is characterized in that the common electrical connection is formed as a substantially integral component part of a common first electrode region which forms the bottom electrode and substantially connects the latter electrically.

This measure achieves the situation where the plurality of capacitors belonging to the capacitor configuration have mutually electrically connected bottom electrodes, which are formed by the first electrode region. An additional electrical connection to be provided and, above all, its structuring within the context of the production process, are dispensed with.

The aspects of the invention and further properties and advantages of the process according to the invention, and also of the capacitor configuration according to the invention, are summarized below.

Particularly space-saving configurations of memory cells, in particular for ferroelectric memories, have been proposed within the context of the chain-FeRAM concept or CFRAM concept, as they are known. One advantage of this concept is that, as a result of the joint use of contacts, lines and/or electrodes by cells provided beside one another on the substrate, the cell area per stored information unit (per bit) can be greatly reduced. A theoretical limit of $4F^2$ per bit is specified. However, on the basis of production necessities, this theoretical lower limit cannot generally be reached. In this case, F represents the so-called minimum structure size of the technology respectively used. This is also referred to as the feature size. This structure size F is used in order to compare cell sizes in technologies employed in different ways.

In a similar way to that in DRAMs (Dynamic Randon Access Memories), a specific minimum size of the storage capacitors is also needed in CFRAMs for a reliable function of the memory cell configuration. This minimum size of the storage capacitors results in a specific minimum region for the capacitor electrodes. In specific technology generations, this minimum region can no longer be accommodated in a planar, that is to say two-dimensional, structuring of the memory cell. In order to be able to achieve this minimum region for these capacitors, a change to a three-dimensional structure is necessary, in which not only the bottom surface but also the side walls and side regions of the applied structures are employed and used. When such three-dimensional capacitors are provided in accordance with the current design rules in a regular array or a regular cell configuration, it is then no longer possible to achieve the theoretical cell area of $4F^2$, in particular in the case of a CFRAM.

Through the use of the procedure according to the invention presented, a process is provided with which the cell area per bit can be reduced considerably, with simultaneous technological simplification of the production procedure.

In the case of CFRAMs, it is always the case that at least two adjacent storage capacitors are connected to a common electrode, preferably to the lower electrode or bottom electrode. The conventional approach is to produce and form two individual capacitors next to one another on the carrier, it also being necessary to ensure appropriate electrical connection of the electrodes, which are initially separated.

The subject of the production process according to the invention is, as has already been described above, various procedures in which, for example, first of all a relatively extended, in particular elongate, capacitor is produced. From the latter, as has already been described above, for example the two necessary capacitors are produced by the removal of appropriate material layers. The distance between the adjacent capacitors can thus be reduced in relation to one another as compared with the prior art, which also results in a reduction in cell size. Furthermore, the production process for the conventionally necessary electrical connection of the bottom electrodes is dispensed with. A further level of lithography is dispensed with.

Viewed overall, through the use of the described production process according to the invention, the distance between adjacent capacitors belonging to the capacitor configuration is reduced and therefore the cell area per bit is reduced, such that it is additionally possible to leave out a level of lithography.

Other features which are considered as characteristic for the invention are set forth in the appended claims.

Although the invention is illustrated and described herein as embodied in a process for producing a capacitor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
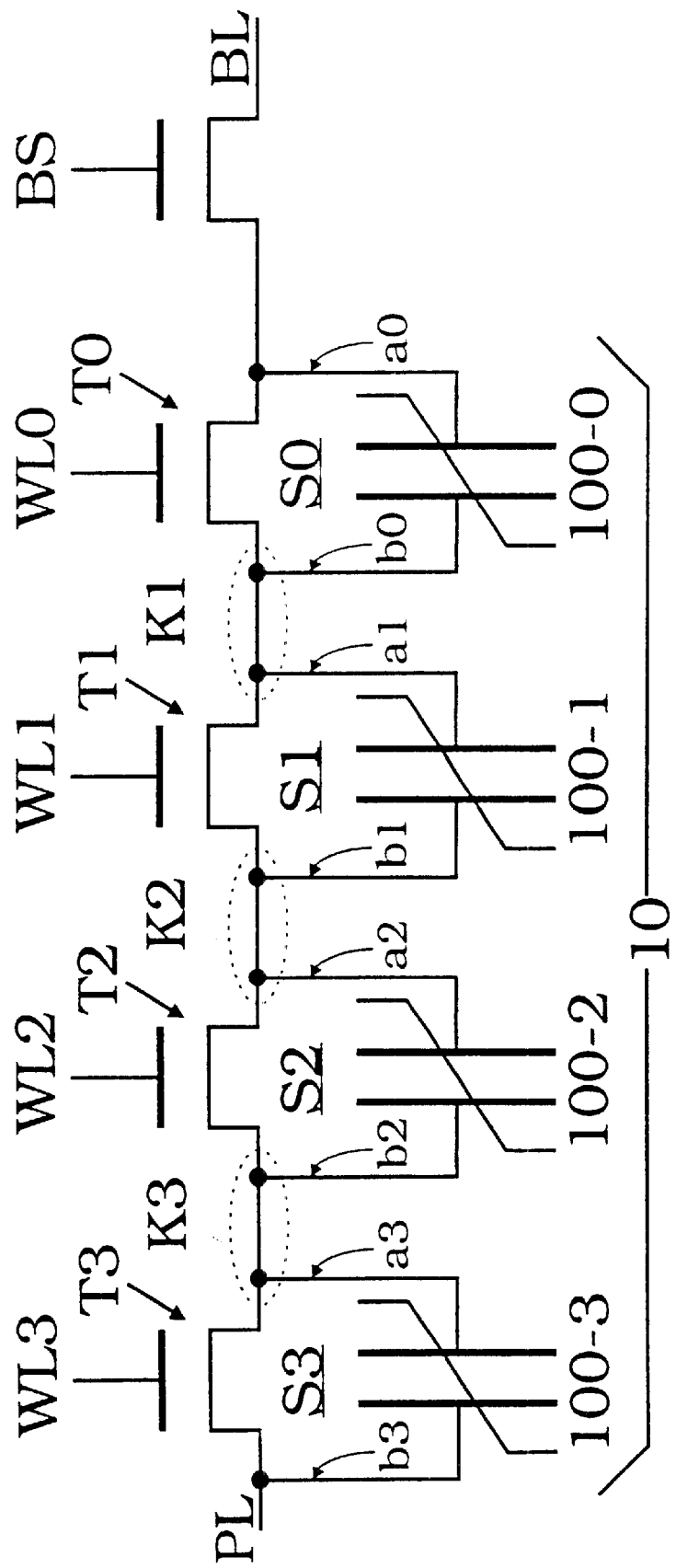
FIG. 1 is a schematic diagram of a basic circuit configuration for a memory device using an embodiment of a capacitor configuration according to the invention produced by the process according to the invention.

Referring now to the figures of the drawings in detail and first, particularly, to FIG. 1 thereof, there is shown in schematic form, the basic circuit configuration for a memory device 1 having four memory cells S0 to S3, specifically in the form of a chain FeRAM or CFRAM.

Each of the memory cells S0 to S3 has a ferroelectric capacitor 100-0 to 100-3, which thus form a capacitor configuration according to the invention. Each of the capacitors 100-0, . . . , 100-3 is connected by its terminals a0, b0 to a3, b3 to the source regions or drain regions of corresponding select transistors T0 to T3, whose gate regions make contact with corresponding word lines WL0 to WL3.

FIG. 1 therefore shows a CFRAM chain having four memory cells S0 to S3. On the input side, this chain is connected via an interconnected chain select transistor or block select transistor BS to the bit line device BL and, on the output side, is connected to a plate line device PL. Through the use of the chain select transistor or block select transistor BS, the respective chain, here including the memory cells S0 to S3, is selected. Within the chain, the individual memory cells S0 to S3 are addressed via the word line devices WL0 to WL3 and the corresponding cell select transistors T0 to T3.

The memory cell capacitors 100-0 to 100-3 are in each case adjacently electrically conductively connected to one another via contact areas K1 to K3. This means that the terminal b0 of the first storage capacitor 100-0 is connected via the terminal area or contact area K1 to the terminal a1 of the second storage capacitor 100-1, and so on.

Figure 2:
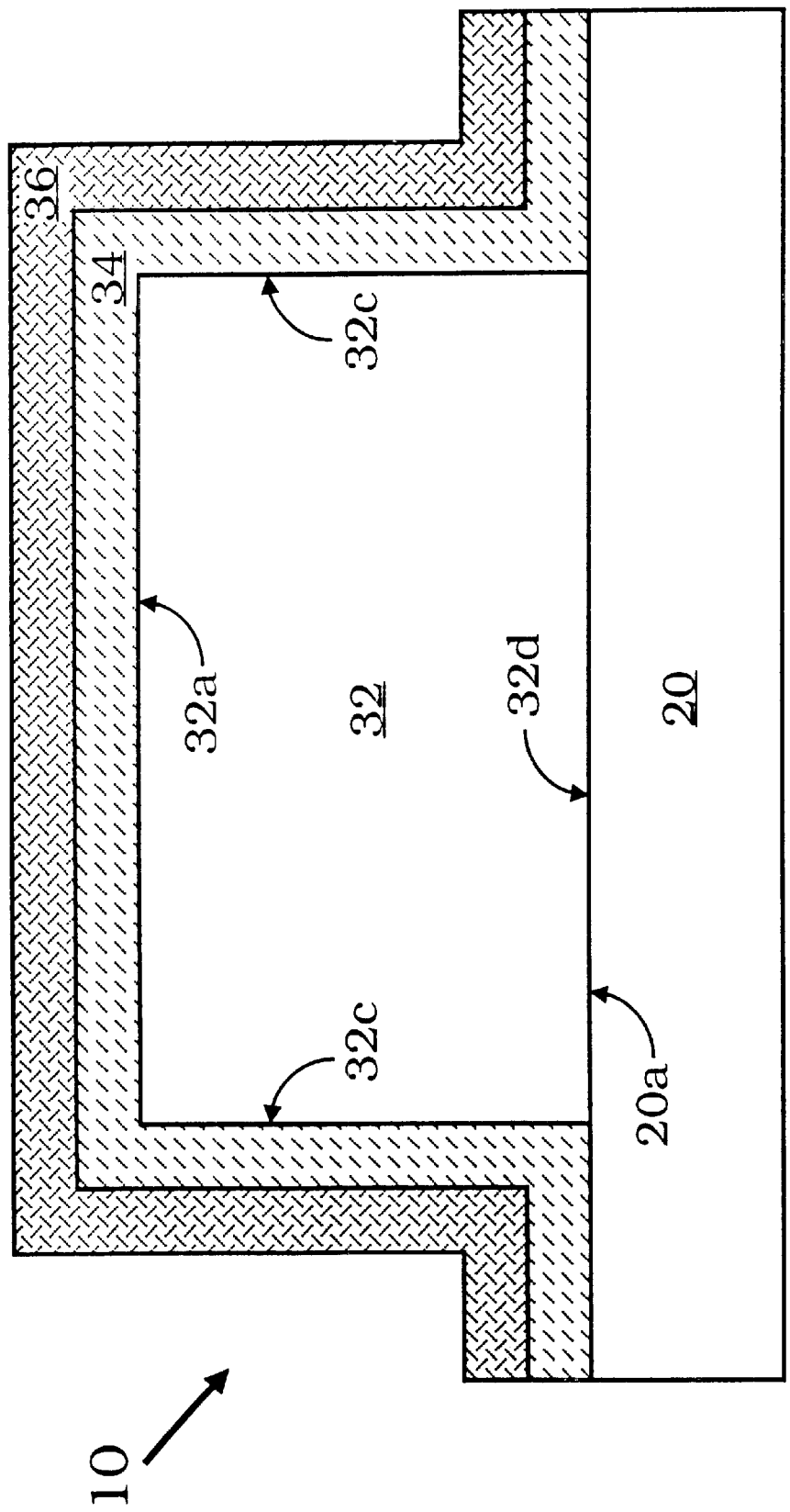
FIG. 2 is a diagrammatic, partial sectional view of a preliminary stage of an embodiment of the capacitor configuration according to the invention using an advantageous mode of the process according to the invention.

FIG. 2 shows a schematic and partially sectional side view of a preliminary stage of the capacitor configuration 10 according to the invention, which has been produced by using one embodiment of the production process according to the invention.

Formed on a carrier 20, in particular a semiconductor substrate or the like, in an area of the surface 20a thereof, is a first electrode area 32. This first electrode area 32 rests with a bottom face 32d on the surface 20a of the carrier 20. In a second process step, a dielectric area 34 is then subsequently applied in such a way that the upper side 32a, the side areas 32c and also areas of the surface 20a which has remained free on the carrier 20 are covered. The dielectric area 34 in this embodiment of the process according to the invention is formed as a coherent layer. A second electrode area 36 is then subsequently applied to this coherent dielectric layer 34 and covers the dielectric area 34 in a substantially coherent manner.

Figure 3:
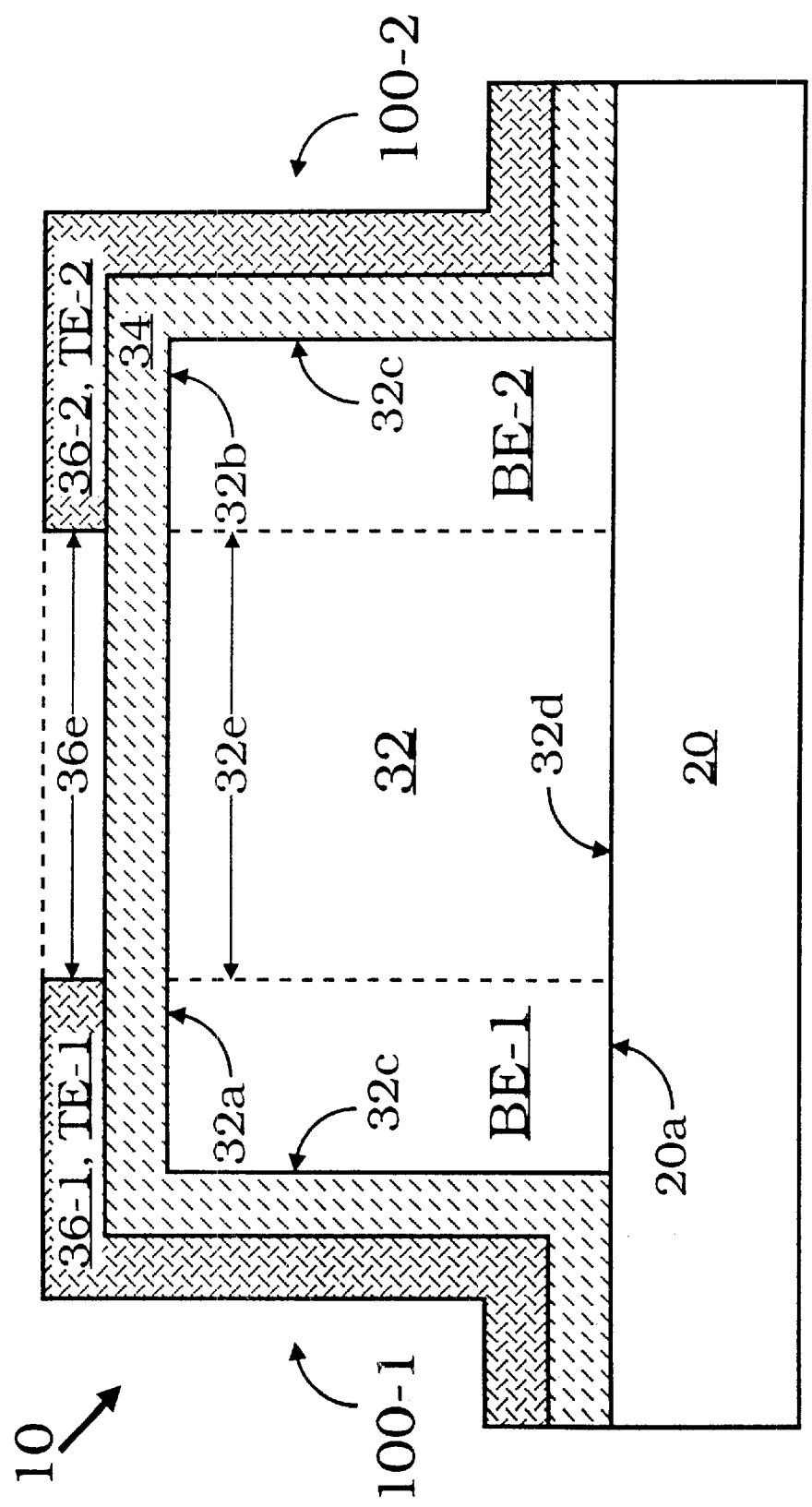
FIG. 3 is a diagrammatic, partial sectional view of an embodiment of the capacitor configuration according to the invention.

FIG. 3 shows an embodiment of a capacitor configuration 10 obtained in accordance with the invention, likewise in a sectional side view.

The embodiment of the capacitor configuration according to the invention shown in the figure has two capacitors 100-1 and 100-2. The two capacitors 100-1 and 100-2 have been applied to the surface 20a of the carrier 20 and possess electrically connected lower or bottom electrodes BE-1 and BE-2, which are formed by the common first electrode area 32. The two capacitors 100-1 and 100-2 also have a common dielectric area 34, which covers the areas of the surface 32a and 32b and also the side faces 32c of the first electrode area 32 and also parts of the surface 20a of the carrier 20. As opposed to the preliminary stage shown in FIG. 2, in the embodiment shown in FIG. 3 of the capacitor configuration 10 according to the invention, an area 36e of the second electrode area 36 above the central surface area 32e of the first electrode area 32 has been removed, so that two second electrode areas 36-1 and 36-2 have been formed, which form the upper electrodes or top electrodes TE-1 and TE-2 of the two capacitors 100-1 and 100-2, the top electrodes TE-1 and TE-2 having no direct electrical contact with each other and therefore being separated from each other.

Figure 4:
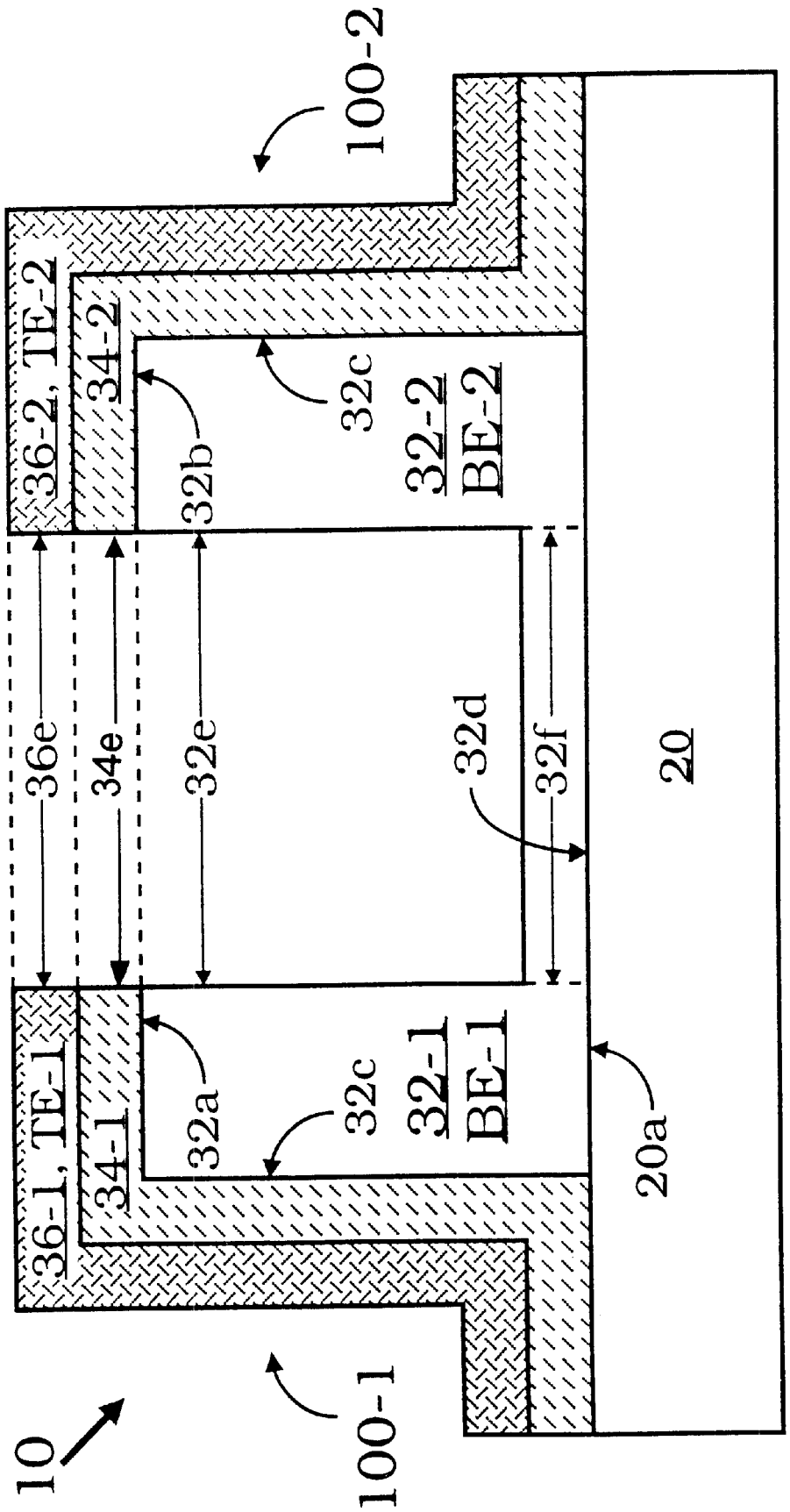
FIG. 4 is a diagrammatic, partial sectional view of a further embodiment of the capacitor configuration according to the invention.

In the embodiment of a capacitor configuration 10 according to the invention shown in FIG. 4, having a first capacitor 100-1 and a second capacitor 100-2, as opposed to the embodiment of FIG. 3, not only has a central area 36e of the originally closed second electrode area 36 been removed, but also a central area 34e, located appropriately underneath, of the dielectric area 34 and also the central area 32e of the first electrode area 32.

The removal of the area 32e of the first electrode area 32 thus forms two substantially physically separated first electrode areas 32-1 and 32-2, which form the lower electrodes or bottom electrodes BE-1 and BE-2 of the first and second capacitor 100-1 and 100-2, but these two bottom electrodes BE-1 and BE-2 being electrically connected to one another via a central connecting area 32f of the first electrode area 32.

Figure 6:
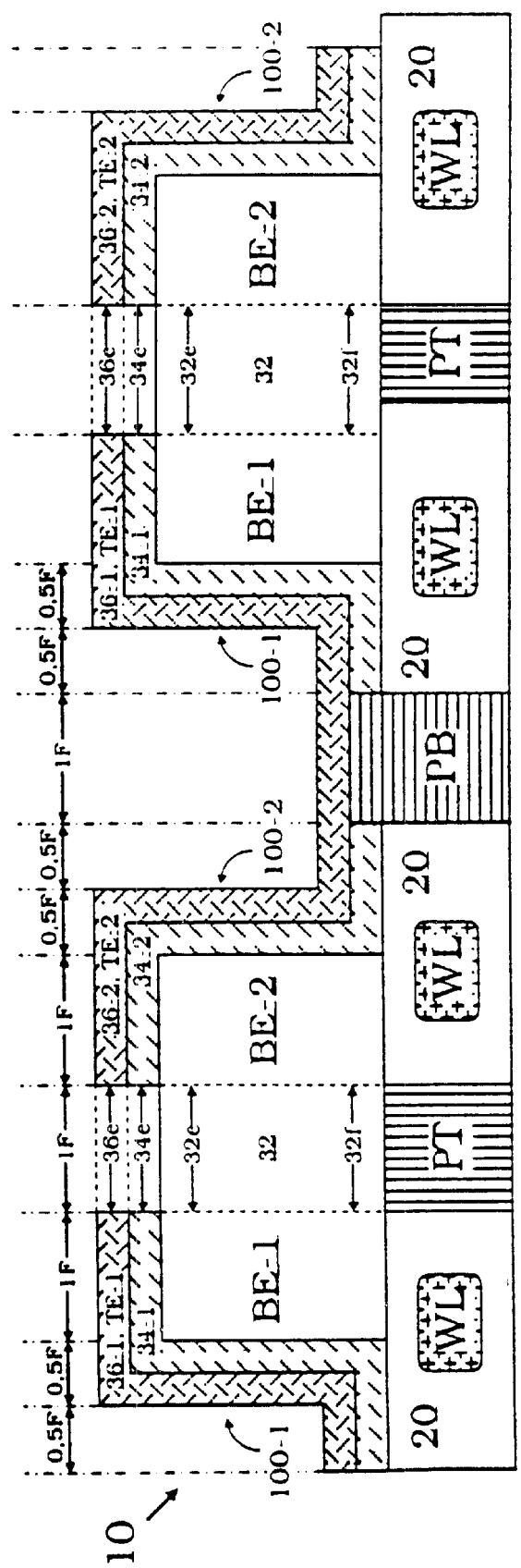
FIG. 6 is a diagrammatic, partial sectional lateral view along the section line X—X of the embodiment of the capacitor configuration according to the invention shown in FIG. 5.
Figure 7:
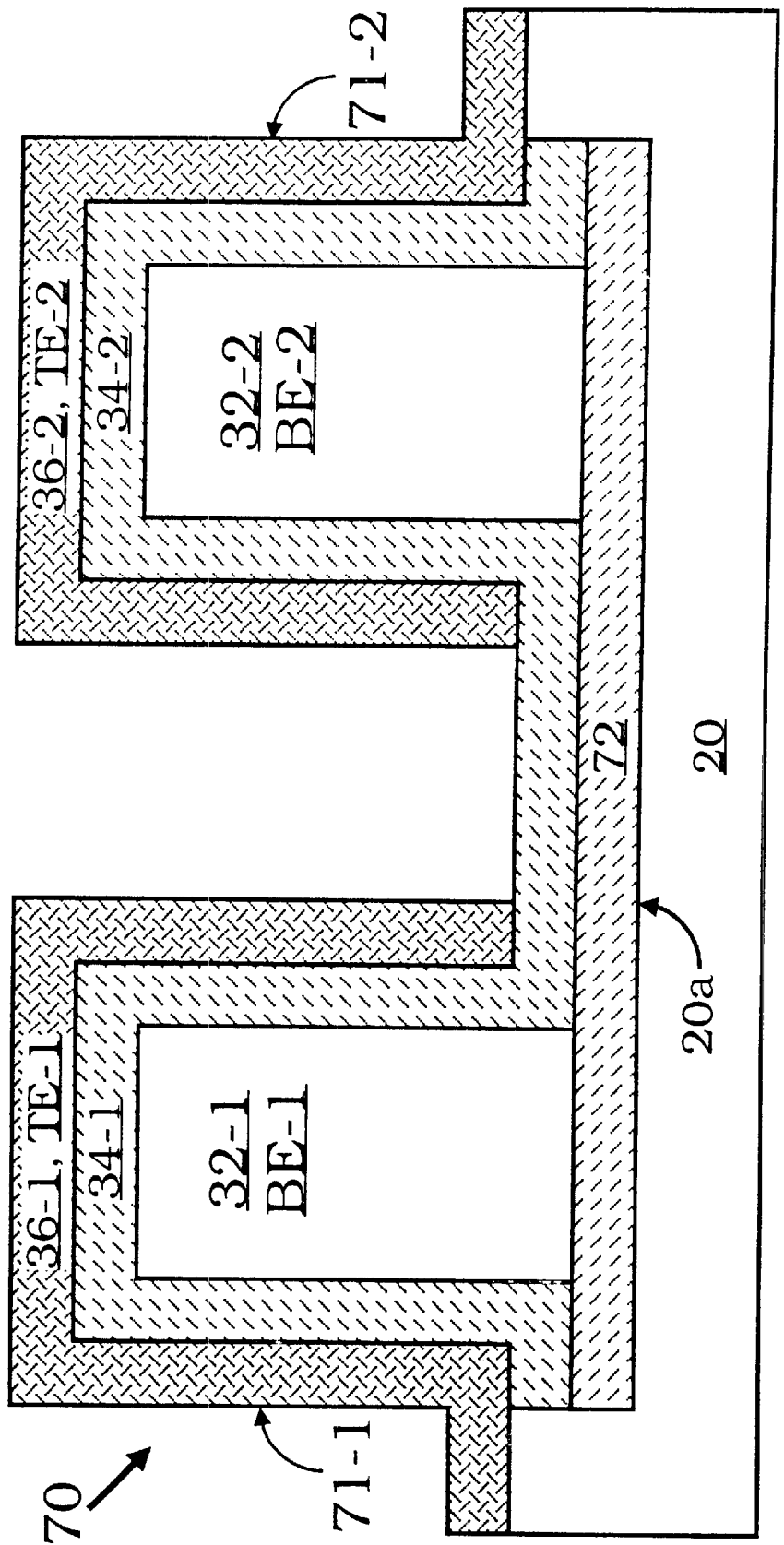
FIG. 7 is a diagrammatic sectional view a capacitor configuration according to the prior art.

In the embodiment of FIG. 6, which likewise shows a capacitor configuration 10 according to the invention in a sectional side view, three pairs of capacitors 100-1, 100-2 have been formed provided in a row on the surface 20a of the carrier 20. In the embodiment shown in FIG. 6, the originally continuous dielectric area 34 and the second electrode area 36 have in each case been interrupted and removed in an area 32e of the first electrode area 32, by removing the central sections 34e and 36e provided above them, but the respective first to electrode area 32 not having been touched and therefore being present in its original form.

The capacitors 100-1 and 100-2 of the capacitor pairs each have a common first electrode area 32, through the use of which the respective bottom electrodes BE-1 and BE-2 are formed. The first electrode areas 32 and the corresponding bottom electrodes BE-1, BE-2 are connected to the substrate or carrier 20 through the use of a plug area PB.

In addition, the mutually opposite capacitors 100-2, 100-1 of adjacent pairs of capacitors are additionally electrically conductively connected to one another via a coherently and jointly formed second electrode area 36. Also provided is a plug area PT, through the use of which the top electrodes TE-2 and TE-1 of the capacitors 100-2 and 100-1 of adjacent pairs are electrically conductively connected to the substrate or carrier 20.

The result, viewed overall, is therefore a layout for the capacitor configuration 10 shown in FIG. 1, the contact areas K1 to K3 being formed by the first electrode areas 32 in conjunction with the respective plug area PB and by the second electrode areas 36 of adjacent capacitor pairs and the respective plug area PT.

In a corresponding way, the wordlines WL are also indicated in schematic form in FIG. 6.

Figure 5:
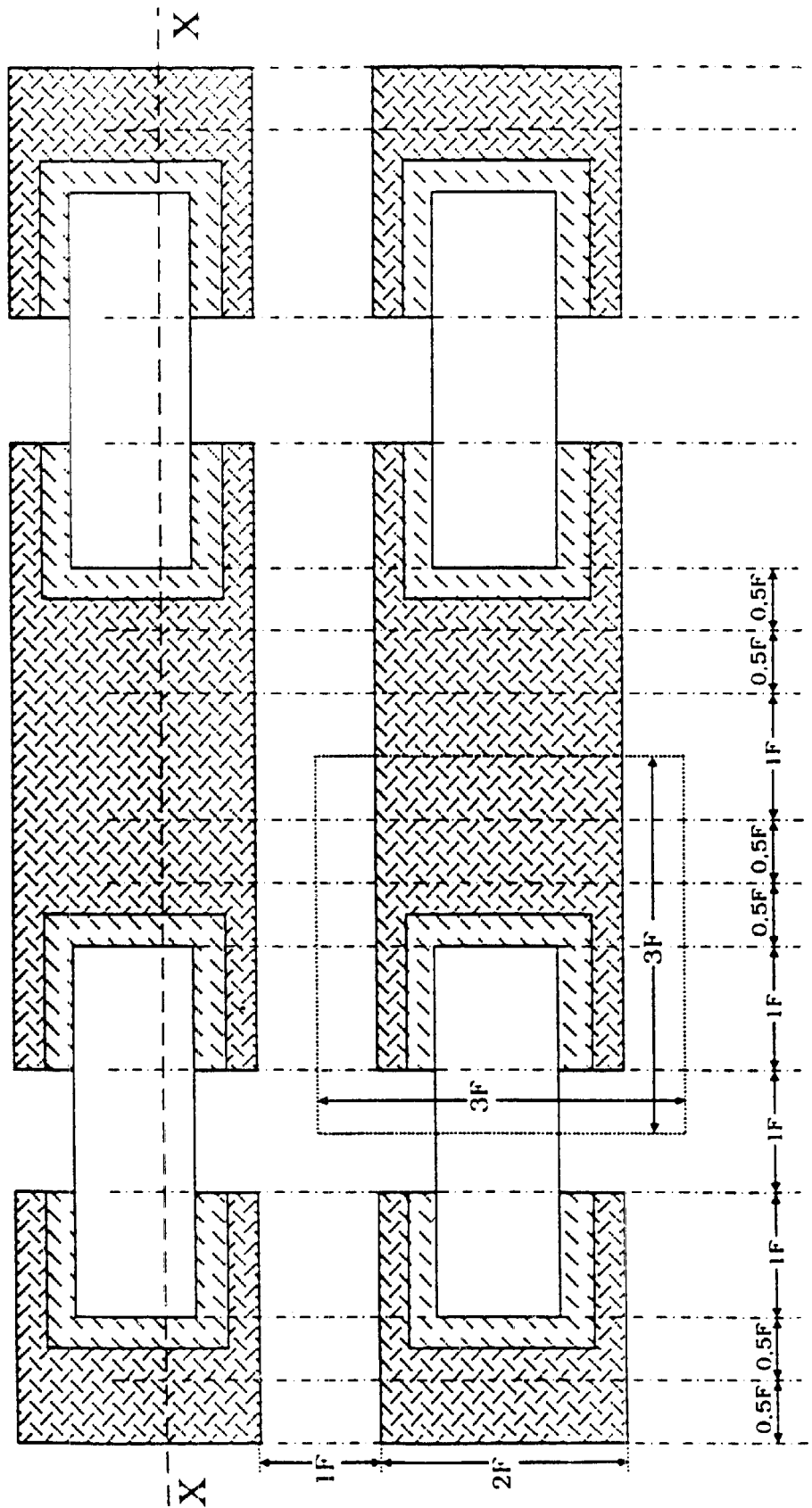
FIG. 5 is a diagrammatic plan view of an embodiment of the capacitor configuration according to the invention, with multiple use of the embodiment shown in FIG. 3.

The embodiment of FIG. 6 is illustrated again in FIG. 5 in a plan view of the layout, in order better to clarify the area relationships as compared with the prior art, the capacitor configuration 10 being continuous in the manner of a row in the lateral direction and the illustration of FIG. 6 resulting from FIG. 5 by making the section along the section line X—X.

In FIG. 5, the smallest unit which can be represented structurally (feature size) is designated by F.

The linear distance between the center of the plug PB for the bottom electrodes BE-1 and BE-2 and the center of the plug PT for the top electrodes TE-1 and TE-2 of adjacent capacitor pairs is 3F. The recesses 34e, 36e in the area 32e of the first electrode area 32 have a linear extent of 1F. The widths of the bottom electrodes BE-1 and BE-2 are likewise 1F. For the side areas of the capacitors 100-1 and 100-2, from the side area 32c of the bottom electrodes BE-1 and BE-2 to the side area of the respectively following second electrode area 34-1 or 34-2, 0.5F is estimated. The lateral width of the capacitor configuration 10 is 2F, and the distance between adjacent linear capacitor configurations 10 is 1F. Since an overlap of the upper electrodes or top electrodes TE-1 and TE-2 with respect to the lower or bottom electrodes BE-1 or BE-2 is dispensed with, the basic area of a capacitor 100-1 or 100-2 is $2F \times 1.5F = 3F^2$.

As compared with the conventional approach, this represents a saving of 25%, as results from a comparison of FIGS. 5 and 6 and FIGS. 8 and 9.

For comparison with FIGS. 2 to 4, FIG. 7 shows a conventional construction of a capacitor configuration 70 with conventional capacitors 71-1, 71-2. In this conventional configuration, first of all a connecting area 72 is explicitly applied to the surface 20a of the carrier 20. Separate bottom electrodes BE-1 and BE-2 are then provided on this connecting area 72, the connecting area 72 being designed to be electrically conductive in order to connect the two bottom electrodes BE-1 and BE-2 electrically conductively to each other. A joint dielectric area 34 is then subsequently formed, covering both bottom electrodes BE-1 and BE-2. Then, in the area of the bottom electrodes BE-1 and BE-2, but not touching or contacting these, separate or mutually separately formed top electrodes TE-1 and TE-2 are subsequently formed as second and separate electrode areas 36-1 and 36-2.

Figure 8:
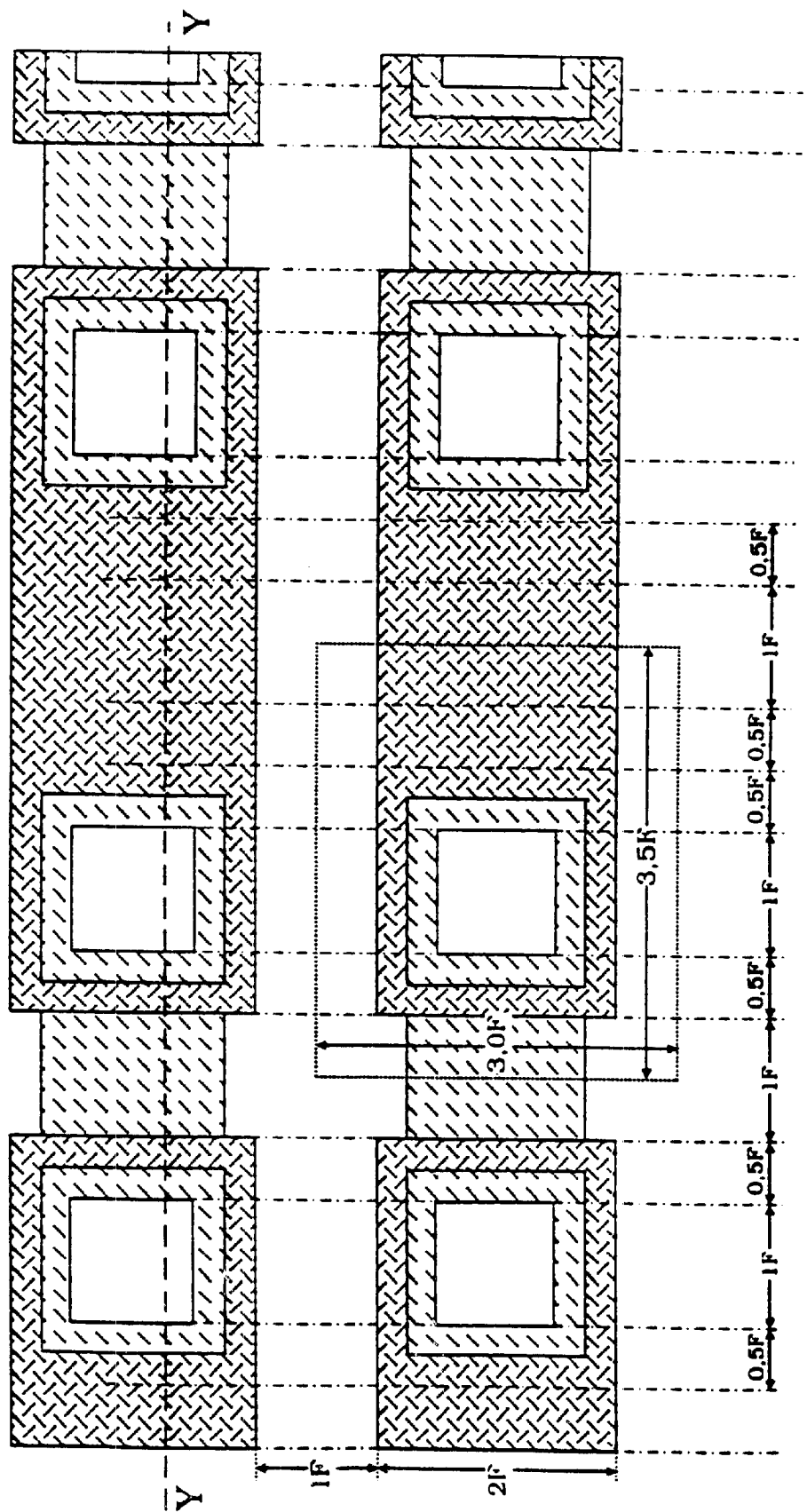
FIG. 8 is a diagrammatic plan view of a conventional capacitor configuration with multiple use of the embodiment shown in FIG. 7.
Figure 9:
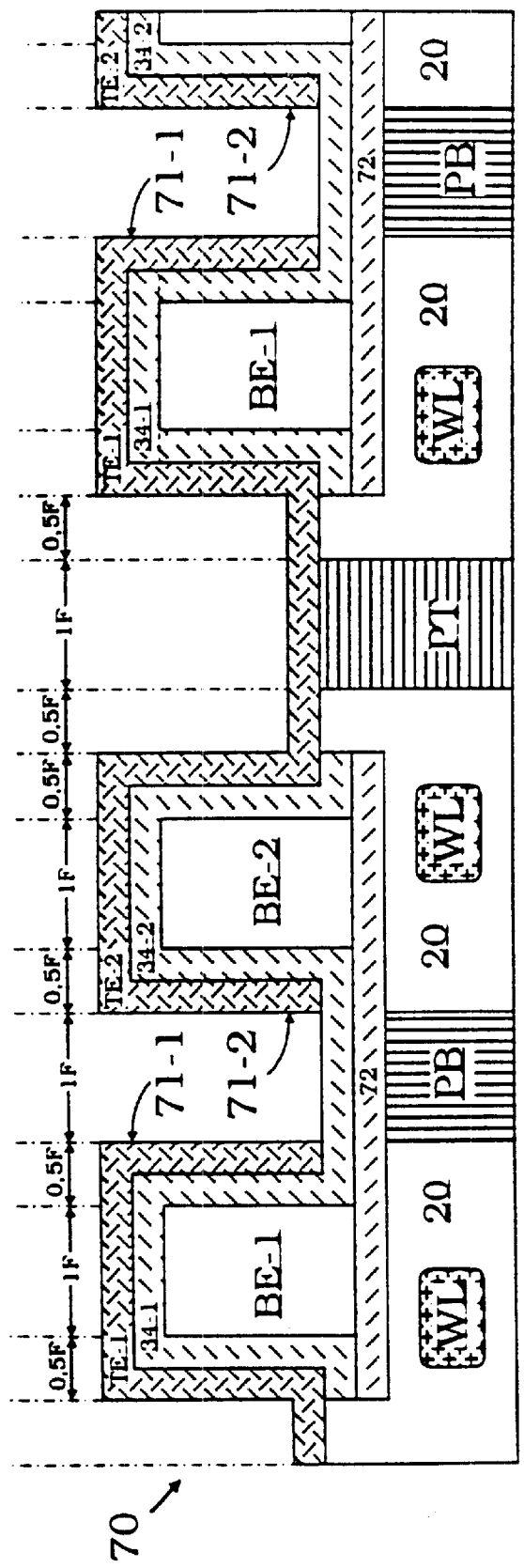
FIG. 9 is a diagrammatic, partial sectional view of the conventional capacitor configuration along the line Y—Y shown in FIG. 8.

FIGS. 8 and 9 then show, in a manner analogous to FIGS. 5 and 6, the conventional capacitor configuration 70 in a plan view of the layout and in a sectional side view of the layout in relation to the section line Y—Y from FIG. 8.

It is worth noting that a comparison between FIG. 8 and the embodiment of FIG. 5 shows that the linear extent of an individual capacitor in the conventional embodiment of FIG. 8 is 3.5F, while, as has already been described above, in the embodiment according to the invention and according to FIG. 5, it is 3F, so that in an area comparison, a capacitor of the capacitor configuration according to the invention takes up $9F^2$ per bit, while in the case of the conventional procedure, this corresponds to a space requirement of $3F \times 3.5F = 10.5F^2$.

This corresponds to an area saving according to the invention of about 14%. Added to this is the fact that, in the case of the conventional procedure, the connecting areas 72 or the straps, as they are known, have to be specifically provided, which makes a further lithography level necessary in the conventional procedure.

We claim:

1. A process for producing a capacitor configuration having a plurality of capacitors with a common contact region, the process which comprises:

forming a common first electrode region for the capacitors of the capacitor configuration on a surface region of a carrier;

forming at least one dielectric region on an upper surface of the common first electrode region;

forming a common, substantially coherent second electrode region by directly applying an electrode material to the at least one dielectric region; and forming a plurality of second electrodes by structuring the common, substantially coherent second electrode region such that the second electrodes are formed over regions of the common first electrode region covered by the at least one dielectric region and such that the second electrodes are not in direct electrical contact with one another.

2. The process according to claim 1, which further comprises forming a plurality of dielectric regions on the common first electrode region such that the dielectric regions are substantially at least not in direct contact with one another.

3. The process according to claim 2, which further comprises forming at least some of the dielectric regions by directly applying a dielectric material to the common first electrode region.

4. The process according to claim 2, which further comprises forming at least some of the dielectric regions by applying a common and substantially coherent dielectric region to the common first electrode region and by subsequently structuring the common and substantially coherent dielectric region.

5. The process according to claim 1, which further comprises forming at least some of the second electrodes by applying the electrode material for the at least some of the second electrodes such that the electrode material is substantially flush with the at least one dielectric region formed at least partly on the common first electrode region.

6. The process according to claim 1, which further comprises forming at least some of the second electrodes by applying the electrode material for the at least some of the second electrodes such that the electrode material substantially covers the at least one dielectric region formed at least partly on the common first electrode region.

7. The process according to claim 1, which further comprises:

forming at least some of the second electrodes by applying the electrode material for the at least some of the second electrodes; and structuring in a joint process the electrode material and a coherent dielectric region formed on the common first electrode region, for providing the at least one dielectric region.

8. The process according to claim 1, which further comprises:

forming at least some of the second electrodes by applying the electrode material for the at least some of the second electrodes; and simultaneously structuring the electrode material and a coherent dielectric region formed on the common first electrode region, for providing the at least one dielectric region.

9. The process according to claim 1, which further comprises structuring, in an intermediate region between adjacent ones of the second electrodes, the common first electrode region by removing part of the common first electrode region forming first electrode areas and a connecting region electrically connecting the first electrode areas.

10. The process according to claim 1, which further comprises structuring, in an intermediate region between adjacent dielectric regions, the common first electrode region by removing part of the common first electrode region forming first electrode areas and a connecting region electrically connecting the first electrode areas.

11. The process according to claim 9, which further comprises removing the part of the common first electrode region from a side facing away from the carrier.

12. The process according to claim 10, which further comprises removing the part of the common first electrode region from a side facing away from the carrier.

13. The process according to claim 1, which further comprises using the common first electrode region as a common bottom electrode for the capacitor configuration.

14. The process according to claim 1, which comprises using the second electrodes as separate top electrodes for the capacitor configuration.

15. The process according to claim 1, which further comprises producing a capacitor configuration for a memory device with FeRAM cells by forming the common first electrode region, the at least one dielectric region, and the plurality of second electrodes.

* * * * *